(12) United States Patent
Kaufmann et al.

(10) Patent No.: US 10,006,969 B2
(45) Date of Patent: *Jun. 26, 2018

(54) SENSOR DEVICE

(71) Applicant: TDK-Micronas GmbH, Freiburg (DE)

(72) Inventors: Timo Kaufmann, Waldkirch-Suggental (DE); Joerg Franke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 563 days.

This patent is subject to a terminal disclaimer.

(21) Appl. No.: 14/683,664

(22) Filed: Apr. 10, 2015

(65) Prior Publication Data
US 2015/0293184 A1    Oct. 15, 2015

(30) Foreign Application Priority Data
Apr. 10, 2014  (DE) .......... 10 2014 005 247

(51) Int. Cl.
*G01R 33/00* (2006.01)
*G01D 5/14* (2006.01)

(52) U.S. Cl.
CPC ......... *G01R 33/0017* (2013.01); *G01D 5/145* (2013.01)

(58) Field of Classification Search
CPC .............. F02N 2200/021; F02N 11/0814
See application file for complete search history.

(56) References Cited

U.S. PATENT DOCUMENTS

| | | | |
|---|---|---|---|
| 6,288,533 B1 | 9/2001 | Haeberli et al. | |
| 8,680,847 B2 | 3/2014 | Franke et al. | |
| 8,866,426 B2 | 10/2014 | Franke et al. | |
| 8,884,611 B2 | 11/2014 | Hunger | |
| 2005/0253578 A1 | 11/2005 | Kawashima et al. | |
| 2010/0148764 A1* | 6/2010 | Abe | G01D 5/145 324/207.25 |
| 2011/0128528 A1* | 6/2011 | Al-Rawi | B62D 6/10 356/138 |
| 2011/0128529 A1* | 6/2011 | Al-Rawi | G01D 5/3473 356/139 |
| 2011/0291645 A1* | 12/2011 | Franke | G01D 5/145 324/207.2 |
| 2011/0291650 A1* | 12/2011 | Franke | G01D 5/145 324/251 |

(Continued)

FOREIGN PATENT DOCUMENTS

DE  10 2009 042 473 A1   4/2011
EP       0 986 162 A1    3/2000

(Continued)

*Primary Examiner* — Jermele M Hollington
*Assistant Examiner* — Alvaro Fortich
(74) *Attorney, Agent, or Firm* — Muncy, Geissler, Olds & Lowe, P.C.

(57) ABSTRACT

A sensor device is provided for suppressing a magnetic stray field, having a semiconductor body with a surface formed in an x-y plane, the x-direction and the y-direction are formed orthogonal to one another, and the sensor device has a first pixel cell and a second pixel cell integrated into the surface of the semiconductor body. A first magnetic field sensor detects a magnetic field in the x-direction and a second magnetic field sensor detects a magnetic field in the y-direction. The two pixel cells in a projection along an imaginary lengthening of the axis are arranged at an edge or next to an extension of the magnet in the x-y plane.

13 Claims, 1 Drawing Sheet

(56) References Cited

U.S. PATENT DOCUMENTS

| | | | |
|---|---|---|---|
| 2012/0176070 A1 | 7/2012 | Wallrafen | |
| 2012/0256283 A1* | 10/2012 | Franke | H01F 5/00 |
| | | | 257/427 |
| 2014/0084906 A1* | 3/2014 | Ruigrok | G01D 5/147 |
| | | | 324/207.21 |

FOREIGN PATENT DOCUMENTS

| | | |
|---|---|---|
| EP | 0 916 074 B1 | 7/2003 |
| EP | 2 117 103 B1 | 7/2010 |
| EP | 2 244 070 A1 | 10/2010 |
| EP | 2 354 769 A1 | 8/2011 |
| WO | WO 2010/060607 A2 | 6/2010 |

\* cited by examiner

SENSOR DEVICE

This nonprovisional application claims priority under 35 U.S.C. § 119(a) to German Patent Application No. 10 2014 005 247.8, which was filed in Germany on Apr. 10, 2014, and which is herein incorporated by reference.

BACKGROUND OF THE INVENTION

Field of the Invention

The present invention relates to a sensor device.

Description of the Background Art

A sensor device for determining the rotation angle of a shaft is known from EP 0 916 074 B1, which corresponds to U.S. Pat. No. 6,288,533.

Furthermore, an IC package with an integrated circuit and a magnetic sensor is known from WO 2010/060607 A2, which corresponds to U.S. Pat. No. 8,680,847, which is incorporated herein by reference. A permanent magnet whose magnetic flux penetrates the sensor is arranged adjacent to the package.

SUMMARY OF THE INVENTION

It is therefore an object of the present invention to provide a device that refines the conventional art.

According to an embodiment of the invention, a sensor device is provided for suppressing a magnetic stray field, whereby the sensor device comprises a semiconductor body with a surface, formed in an x-y plane, and a back surface, whereby the x-direction and the y-direction are formed orthogonal to one another, and the semiconductor body or the back surface of the semiconductor body is connected to a substrate, and the sensor device has a first pixel cell and a second pixel cell, whereby both pixel cells are integrated into the surface of the semiconductor body together with a circuit arrangement, and each pixel cell has a first magnetic field sensor and a second magnetic field sensor, and whereby the first magnetic field sensor detects a magnetic field in the x-direction and the second magnetic field sensor a magnetic field in the y-direction, and the first pixel cell is spaced apart from the second pixel cell along a connecting line, and whereby preferably the substrate and the semiconductor body are disposed in the same IC package, and an axis formed in a z-direction is provided, whereby the z-direction is formed orthogonal to the x-y plane, and whereby a magnet is provided, whereby the magnet has a planar main extension surface in the direction of the x-y plane and has a magnetization with two magnetic poles in the direction of the x-y plane, and whereby the IC package is spaced apart from the main extension surface of the magnet such that the surface of the semiconductor body is oriented parallel to the main extension surface of the magnet, and whereby the magnet is mounted rotatable around the z-direction relative to the IC package, and whereby an imaginary lengthening of the axis penetrates the magnet in the center of gravity of the main extension surface of the magnet, and the two pixel cells in a projection along the imaginary lengthening of the axis are arranged at the edge or next to the extension of the magnet in the x-y plane.

The arrangement with two magnetic poles can be called a diametric magnetization. It can be understood further that a signal, dependent on the strength of the magnetic field, can be induced by the magnet in the magnetic field sensors. Provided that the magnet or the IC package rotates, the signals have a sinusoidal or cosinusoidal shape.

An advantage of the device of the invention is that both the rotation angle of a stationary shaft, as well as the rotation angle of a rotating shaft, can be determined by spacing apart two pixel cells with the particular two-dimensional design of the magnetic field sensors in conjunction with the quadrupole arrangement of the magnet. Stated differently, the sensor device can be used for detecting the rotation angle of the shaft. For this purpose, the signals of the magnetic field sensors are processed with a differential evaluation method; i.e., the rotation angle of the shaft can be determined from the signal differences between the first pixel cell and the second pixel cell and from the predetermined magnetic pole arrangement. In particular, in an automatic start-stop system of a motor vehicle, the position of the crankshaft or the position of the camshaft can be determined hereby in the case of an idle engine as well. Turning on of the engine can be made easier by this. A further advantage is that the effects of a stray field, for example, due to the Earth's magnetic field or high-power cables, for example, in motor vehicles, especially in electric/hybrid vehicles, can be suppressed in a simple and reliable manner by the double design of the magnetic field sensors both in the x-direction and in the y-direction. High-power cables are understood to be particularly cables that conduct high currents above 10 amperes. As a result, the device of the invention can be used for suppressing magnetic DC field components.

In an embodiment, each pixel cell comprises a third magnetic field sensor, whereby the third magnetic field sensor detects a magnetic field in the z-direction and, in this case, the z-direction is formed orthogonal to the x-direction and orthogonal to the y-direction, so that each pixel cell is made as a 3-dimensional magnetic field sensor. Tests have shown that it is advantageous to arrange each of the two pixel cells near an outer edge of the semiconductor body in order to create hereby a large distance to one another. It is clear that the accuracy of the angle determination of the shaft can be increased with an increasing distance between the two pixel cells. In a further embodiment, an integrated circuit is formed on the semiconductor body between and/or next to the two pixel cells, whereby the integrated circuit has an electrical functional connection to the two pixel cells. In particular, with the integrated circuit the magnetic field sensors can be supplied with an operating current and can evaluate the signal induced by the applied magnetic field.

In an embodiment, in order to determine the magnetic flux of the particular spatial direction at the same point, the magnetic field sensors in the pixel cell have a center of gravity, whereby the centers of gravity of the individual magnetic field sensors coincide and form a common center of gravity. The particular common center of gravity in the present case is understood as the intersection point of the two magnetic field sensors in one of the pixel cells. It can be understood that the intersection point lies in the middle of the particular magnetic field sensor; i.e., the remaining lengths of the particular sensor are equally long on both sides of the intersection point. In a refinement, the magnetic field sensors each have a main extension surface, whereby the main extension surfaces of the magnetic field sensors are formed orthogonal to one another. Tests have shown that it is advantageous to configure the magnetic field sensors as Hall sensors formed orthogonal to one another or in pairs at right angles to one another and, in this case, to arrange two of the Hall sensors as vertical Hall sensors; i.e., the main extension surface of each of the two vertical Hall sensors is formed perpendicular to the surface of the semiconductor body. In an exemplary embodiment, the Hall sensors can be made in each case as Hall plates.

In a further embodiment, the magnet can be configured as a circle in the x-y plane, whereby the radius of the circle is greater than half the length of the connecting line or, provided the magnet is not configured as a ring magnet, the magnet is configured as a square and half of the diagonal of the square is greater than half the length of the connecting line or alternatively the diameter of the circle or the diagonal of the square is greater than half the length of the connecting line. It is advantageous in particular to make the magnetic poles as two equally large circle segments or as two equally large rectangles or squares.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1b shows a cut along a shaft according to FIG. 1a;

FIG. 2b shows a cut along a shaft according to FIG. 2a.

DETAILED DESCRIPTION

Figure 1A:
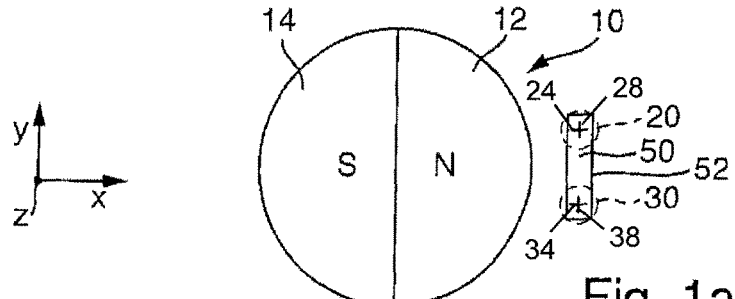
FIG. 1a shows a top plan view of a magnet with two magnetic poles according to an embodiment.

The illustration in FIG. 1 a shows a top plan view of a magnet 10 with two magnetic poles 12, 14 according to a first embodiment, whereby the individual circle segments of the magnetic poles are made equal in size. It is understood that in the case of two magnetic poles 12, 14, a magnetic pole 12 is formed as a north pole and a magnetic pole 14 as a south pole. Furthermore, a first pixel cell 20 is configured with a first magnetic field sensor 24 formed in an x-direction and with a second magnetic field sensor 28 formed in a y-direction, and a second pixel cell 30 is configured with a first magnetic field sensor 34 formed in the x-direction and a second magnetic field sensor 38 formed in the y-direction. First magnetic field sensors 24 and 34 are formed orthogonal to the respective second magnetic field sensors 28 and 38 and have a first center of gravity 42 formed in first pixel cell 20 and a further first center of gravity 43 formed in second pixel cell 30.

The Hall plates each have a main extension surface formed in a z-direction, whereby in the illustrated x-y plane only a projection onto a narrow side surface of the Hall plates is visible. First pixel cell 20 and second pixel cell 30 are formed in the surface of a semiconductor body 50. Semiconductor body 50 is disposed in an IC housing 56. An integrated circuit (not shown) is formed on surface 52 of semiconductor body 50 between first pixel cell 20 and second pixel cell 30.

Figure 1B:
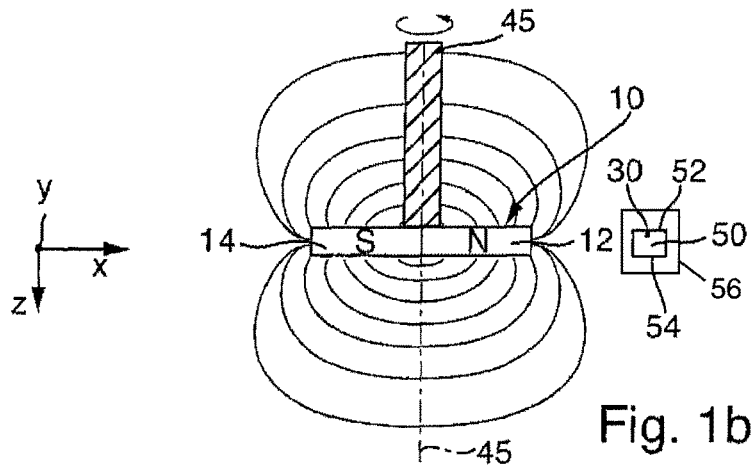

A cut along a shaft 45 according to the first embodiment is shown in the illustration in FIG. 1b. It is understood that the magnet and/or the IC package can be rotated against one another around axis 45. Only the differences from the illustration in FIG. 1 a will be explained below. In the present case, magnet 10 is arranged in a projection along the imaginary lengthening of shaft 45 next to the extension of magnet 10 in the x-y plane such that the two pixel cells 20, 30 have a distance to the outer edge of magnet 10. Shaft 45 has the longitudinal axis in the z-direction. Semiconductor body 50 has a back surface 54 in addition to a surface 52. Semiconductor body 50 with the two pixel cells 20 and 30 is arranged in a projection along the imaginary lengthening of shaft 45 next to the extension of magnet 10 in the x-y plane.

As soon as the shaft with the magnet rotates, a Hall voltage is induced in the Hall plates, provided an operating current flows through the Hall plates.

Figure 2A:
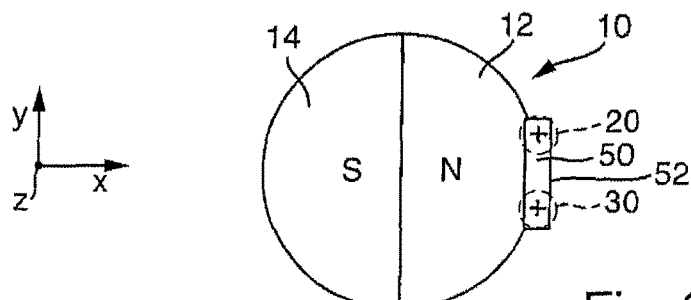
FIG. 2a shows a top plan view of a magnet with two magnetic poles according to an embodiment.
Figure 2B:
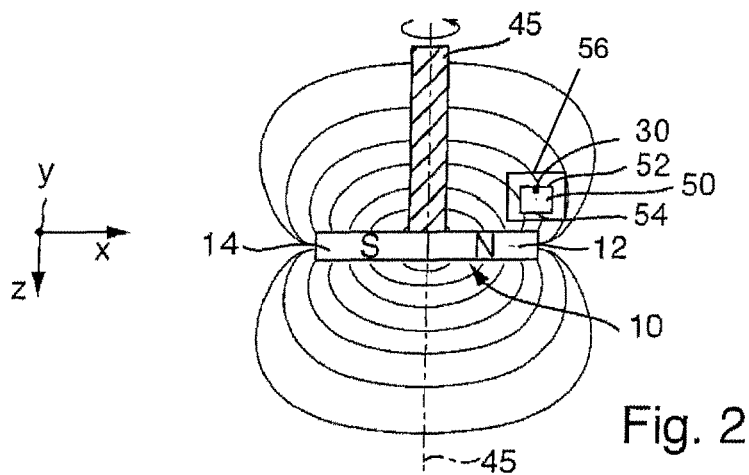

The illustration of FIG. 2a shows a top plan view of a magnet 10 with two magnetic poles 12, 14 according to a second embodiment. Only the differences from the illustration in FIG. 1 a will be explained below. Semiconductor body 50 is arranged in a projection along the imaginary lengthening of shaft 45 next to the extension of magnet 10 in the x-y plane such that the two pixel cells 20, 30 are arranged precisely at the edge of magnet 10. In the illustration of FIG. 2b, a cut along a shaft 45 is shown for the present embodiment.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A sensor device for suppressing a magnetic stray field, the sensor device comprising:
a semiconductor body with a surface formed in an x-y plane and a back surface, an x-direction and a y-direction being formed orthogonal to one another, the semiconductor body being arranged on a substrate;
a first pixel cell;
a second pixel cell, the first and second pixel cells being formed in the surface of the semiconductor body together with a circuit arrangement, each of the first and second pixel cells having a first magnetic field sensor and a second magnetic field sensor, the first magnetic field sensor detects a magnetic field in the x-direction and the second magnetic field sensor detects a magnetic field in the y-direction, the first pixel cell being spaced apart from the second pixel cell along a connecting line;
an axis formed in a z-direction formed orthogonal to the x-y plane; and
a magnet that has a planar main extension surface in a direction of the x-y plane and has a magnetization with two magnetic poles in the direction of the x-y plane,
wherein an integrated circuit (IC) housing is spaced apart from the main extension surface of the magnet such that the surface of the semiconductor body is oriented parallel to the main extension surface of the magnet,
wherein the magnet is mounted rotatable around the z-direction relative to the IC housing,
wherein an imaginary lengthening of the axis penetrates the magnet in the center of gravity of the main extension surface of the magnet, and
wherein the first and second pixel cells in a projection along the imaginary lengthening of the axis are arranged at an edge or next to N extension of the magnet in the x-y plane.

2. The sensor device according to claim 1, wherein each of the first and second pixel cells comprises a third magnetic field sensor, and wherein the third magnetic field sensor detects a magnetic field in the z-direction and the z-direction is formed orthogonal to the x-direction and orthogonal to the y-direction so that each pixel cell is made as a 3-dimensional magnetic field sensor.

3. The sensor device according to claim 1, wherein each of the first and second pixel cells is formed near an outer edge of the semiconductor body in order to create a large distance to one another.

4. The sensor device according to claim 1, wherein an integrated circuit is formed on the semiconductor body between and/or next to the first and second pixel cells and wherein the integrated circuit has an electrical functional connection to the first and second pixel cells.

5. The sensor device according to claim 1, wherein the magnetic field sensors in the first pixel cell and the magnetic field sensors in the second pixel cell have a common center of gravity in order to determine a magnetic flux at a same point of each of the first and second pixel cells.

6. The sensor device according to claim 1, wherein the magnetic field sensors each have a main extension surface and wherein the main extension surfaces of the magnetic field sensors are formed in pairs at right angles to one another.

7. The sensor device according to claim 6, wherein the magnetic field sensors are formed as Hall sensors, wherein the Hall sensors formed as vertical Hall sensors are arranged in pairs at substantially right angles to one another, and wherein the main extension surface of each of the two vertical Hall sensors is formed substantially perpendicular to the surface of the semiconductor body.

8. The sensor device according to claim 7, wherein the magnetic field sensor of each pixel cell is configured as Hall plates.

9. The sensor device according to claim 1, wherein the magnet is configured as a circle or as a square in the x-y plane, and wherein a radius of the circle or half of a diagonal of a square is greater than half of a length of the connecting line.

10. The sensor device according to claim 1, wherein the magnetic poles are made as two equally large circle segments or as two equally large rectangles.

11. The sensor device according to claim 1, wherein the sensor device detects a rotation angle of the magnet connected to the axis or to a shaft.

12. The sensor device according to claim 1, wherein the sensor device determines a rotation angle of a magnet connected to a stationary axis or to a shaft.

13. The sensor device according to claim 1, wherein the sensor device detects a rotation angle of the axis that penetrates the magnet in a center of gravity of the main extension surface of the magnet and a shaft for a differential operation.

* * * * *